United States Patent
Han et al.

(10) Patent No.: US 6,870,127 B2
(45) Date of Patent: Mar. 22, 2005

(54) CHIP SCALE MARKER AND MARKING METHOD

(75) Inventors: You Hie Han, Daejeon (KR); Chang Su Jun, Seoul (KR); Yang Ghi Min, Kyungki-do (KR)

(73) Assignee: EO Technics Co., Ltd., Anyang (KR)

( * ) Notice: Subject to any disclaimer, the term of this patent is extended or adjusted under 35 U.S.C. 154(b) by 97 days.

(21) Appl. No.: 10/610,911

(22) Filed: Jul. 2, 2003

(65) Prior Publication Data

US 2004/0118821 A1 Jun. 24, 2004

(30) Foreign Application Priority Data

Dec. 21, 2002 (KR) .................................. 10-2002-0082082

(51) Int. Cl.[7] ........................ B23K 26/00; B23K 26/14; B23K 26/16; B23K 26/18
(52) U.S. Cl. .............................. 219/121.68; 219/121.69
(58) Field of Search ....................... 219/121.68, 121.69, 219/121.67, 121.85, 121.82, 121.83

(56) References Cited

U.S. PATENT DOCUMENTS

| | | | | |
|---|---|---|---|---|
| 4,941,255 A | * | 7/1990 | Bull | ............................ 29/833 |
| 6,599,760 B2 | * | 7/2003 | Watanabe | ........................ 438/5 |
| 2002/0004358 A1 | * | 1/2002 | Vepa et al. | .................... 451/41 |
| 2004/0031779 A1 | * | 2/2004 | Cahill et al. | ........... 219/121.83 |
| 2004/0060910 A1 | * | 4/2004 | Schramm | ................ 219/121.69 |
| 2004/0144760 A1 | * | 7/2004 | Cahill et al. | ........... 219/121.68 |
| 2004/0152233 A1 | * | 8/2004 | Nemets et al. | .............. 438/106 |

FOREIGN PATENT DOCUMENTS

| | | |
|---|---|---|
| JP | 09-248692 | 9/1997 |

* cited by examiner

*Primary Examiner*—M. Alexandra Elve
(74) *Attorney, Agent, or Firm*—Burns, Doane, Swecker & Mathis, L.L.P.

(57) ABSTRACT

A chip scale marker includes a laser system performing laser marking, a wafer holder on which a wafer subject to the laser marking is mounted, the wafer holder comprising a vacuum plate disposed at a center of the wafer holder for sucking the wafer and a wafer rotating unit provided at a circumference of the vacuum plate and having an open area facing the laser system, a camera disposed above the wafer holder to photograph the wafer, and a warpage removing unit provided above the wafer holder for removing warpage from the wafer.

27 Claims, 10 Drawing Sheets

CHIP SCALE MARKER AND MARKING METHOD

BACKGROUND OF THE INVENTION

This application claims the priority of Korean Patent Application No. 2002-82082 filed on Dec. 21, 2002 in the Korean Intellectual Property Office, the disclosure of which is incorporated herein in its entirety by reference.

1. Field of the Invention

The present invention relates to a chip scale marker and a marking method, and more particularly, to a chip scale marker which can constantly maintain a marking distance between a laser system and a wafer by removing a warpage of the wafer on a wafer holder when characters are marked on a wafer chip using a laser beam, and a marking method using the chip scale marker.

2. Description of the Related Art

A great number of chips are formed on a wafer in a manufacturing process of a semiconductor device. Characters and/or numbers are marked on a surface of each chip to classify the chips by their production lot numbers. A chip scale marker using a laser beam is used for the above purpose. In the past, a lot number was marked on each chip after dicing. However, with the latest development of technologies, integrated circuits (ICs) can be made smaller and lighter so that, to improve an efficiency in work and mass production, dicing is performed after marking is performed on each chip on the wafer. Nevertheless, since the thickness of a wafer remains the same or decreases while the size of the wafer increases, the wafer is warped.

FIG. 1 is a sectional view illustrating the structure of a typical chip scale marker 10. Referring to FIG. 1, a wafer w is placed on a wafer holder 20 and a laser system 30 is arranged under the wafer holder 20. A laser beam oscillated from a laser source of the laser system 30 passes through a Galvano scanner (not shown) and an F-θ lens (not shown) and is irradiated on chips on the wafer w to record characters on a surface of the chips. The laser system is disclosed in Japanese Patent Publication No. H9-248,692.

A camera 40 to recognize the chip position of the wafer is arranged above the wafer holder 20. The camera 40 is moved by being connected to an X-Y stage 50. The X-Y stage 50 and the wafer holder 20 are installed on a table 60.

FIG. 2 is a view illustrating a depth of focus (DOF) of a laser beam irradiated on the wafer. FIG. 3 is a view illustrating a warpage of a wafer loaded on the wafer holder.

Referring to FIG. 2, a laser beam passing through the Galvano scanner (not shown) passes through the f-θ lens 34 and is irradiated on a chip on the wafer which is disposed parallel to the f-θ lens 34. Quality marking can be performed only when a marking surface, that is, a surface of the chip, is disposed within a range of DOF (depth of focus). The DOF can be expressed by the following Equation 1.

$$DOF = \pm 2\lambda (f/D)^2 \quad [\text{Equation 1}]$$

Here, "D" is a diameter of an incident beam, "f" is a focal length, and "λ" is a wavelength of a laser beam.

The wafer including a plurality of chips is warped in one direction due to its own weight, coating of a wafer surface, and other process. The warpage phenomenon is serious when the size of the wafer is large, the wafer is thin, and the amount of compression during curing of a coating material is great. When a deviation of height (h of FIG. 3) of a processing surface of a wafer due to the warpage phenomenon is greater than the DOF, beam density and size differ according to the position of the chip on the processing surface of the wafer. Thus, the quality of marking is lowered, the line width is not constant, and the position of marking is changed.

SUMMARY OF THE INVENTION

To solve the above and/or other problems, the present invention provides a chip scale marker which can quickly and accurately perform laser marking by removing warpage of a wafer.

Also, the present invention provides a marking method using the chip scale marker.

According to an aspect of the present invention, a chip scale marker comprises a laser system performing laser marking; a wafer holder on which a wafer subject to the laser marking is mounted, the wafer holder comprising a vacuum plate disposed at a center of the wafer holder for sucking the wafer and a wafer rotating unit provided at a circumference of the vacuum plate and having an open area facing the laser system; a camera disposed above the wafer holder to photograph the wafer; and a warpage removing unit provided above the wafer holder for removing warpage from the wafer.

The open portion of the wafer holder is at least ¼ of the wafer mounted thereon.

The wafer rotating unit comprises a first plate which is annular and rotates on the wafer holder; a second plate which is annular and rotates on the first plate; and a third plate which is annular and disposed between the vacuum plate and the second plate, wherein the second plate is rotated by a driving unit provided on the first plate, and the third plate is in contact with the second plate so as to be moved up and down by rotation of the second plate and has an open area corresponding to the open area of the wafer holder.

An outer circumference of the first plate has a teethed portion and a pinion gear rotating the teethed portion of the first plate is provided around the first plate.

The vacuum plate has a plurality of holes on a surface of the vacuum plate, the inside of the vacuum plate has a hollow structure, and a vacuum pump is connected to a lower portion of the vacuum plate.

The driving unit is a pneumatic cylinder or an electric cylinder having a body fixed at an outer circumference of the first plate and an end of a cylinder rod protruding from the body connected to the second plate.

A plurality of inclined grooves contacting a member protruding from the third plate are formed on an inner circumferential surface of the second plate. The protruding member are a plurality of support pins formed at an outer circumference of the third plate, placed on the inclined grooves, making the third plate supported by the second plate, and moving the third plate up and down with respect to the first plate while moving along the inclined grooves according to rotation of the second plate.

To enable vertical lift of the third plate when the second plate rotates, a plurality of pins are form on the first plate and a plurality of holes corresponding to the pins are formed in the third plate.

The wafer rotating unit comprises a fourth plate which is annular and rotates on the wafer holder; a fifth plate which is rotated by the fourth plate on the fourth plate; and a vertical transfer shaft provided on the wafer holder and vertically moving the fifth plate by holding one side of the fifth plate, wherein the fifth plate has an open area corresponding to the open area of the wafer holder.

An outer circumference of the fourth plate has a teethed portion and a pinion gear rotating the teethed portion of the fourth plate is provided around the fourth plate.

To enable vertical lift of the fifth plate when the fourth plate rotates, a plurality of pins are form on the fourth plate and a plurality of holes corresponding to the pins are formed in the fifth plate.

The warpage removing unit moves vertically above the wafer and is a bag filled with a predetermined filler to apply a force downward on the wafer.

An inner portion of the bag is vinyl coated and the outer portion of the bag is a conductive textile material which is made of polyester (PET) by adding Cu or Ni metal.

An outer portion of the bag is a conductive textile material which is made of polyester (PET) by adding Cu or Ni metal and the filler is compressed air. According to another aspect of the present invention, a method for performing marking using a chip scale marker including a laser system performing laser marking, a wafer holder on which a wafer subject to the laser marking is mounted, the wafer holder comprising a vacuum plate disposed at a center of the wafer holder for sucking the wafer and a wafer rotating unit provided at a circumference of the vacuum plate and having an open area facing the laser system, a camera disposed above the wafer holder to photograph the wafer, and a warpage removing unit provided above the wafer holder for removing warpage from the wafer, the method comprising the steps of (a) mounting the wafer on the wafer holder; (b) removing warpage by pressing the wafer using the warpage removing unit; (c) measuring positions of chips by photographing the wafer to recognize the positions of chips; (d) marking the chips through the open portion of the wafer holder using the laser system according to the information on the positions of the chips; (e) releasing the warpage removing unit from the wafer; and (f) repeating steps (b) through (e) by rotating the wafer by a predetermined angle using the wafer rotating unit.

The step (b) of the method further comprises a step of fixing the wafer on the vacuum plate by sucking the wafer.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1:
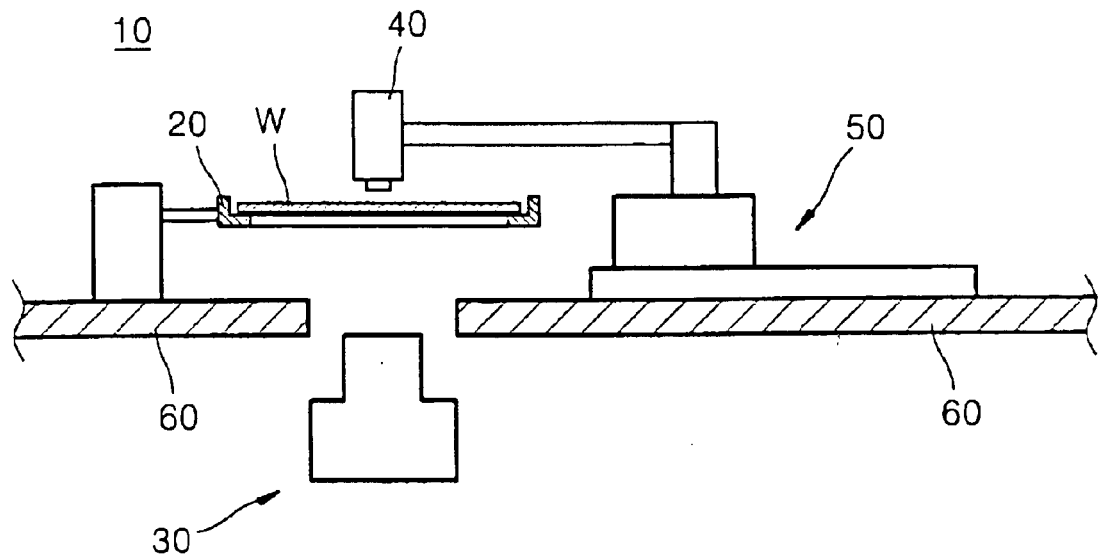
FIG. 1 is a view illustrating a typical chip scale marker.
Figure 2:
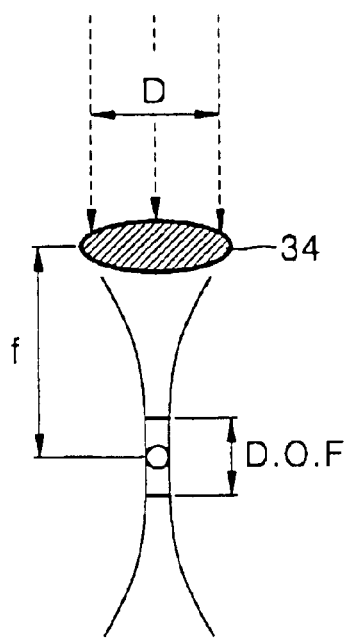
FIG. 2 is a view illustrating a depth of focus (DOF) of a laser beam irradiated on a wafer.
Figure 3:
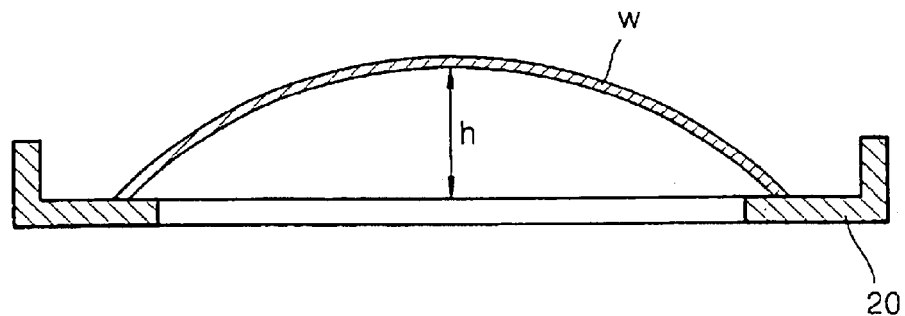
FIG. 3 is a sectional view illustrating the warpage of a wafer on the wafer holder.

A first preferred embodiment of a marking distance correcting apparatus of a chip scale marker of the present invention will now be described in detail with reference to attached drawings. Here, the thickness of layers or areas shown in the drawings are exaggerated for the convenience of explanation.

Figure 4:
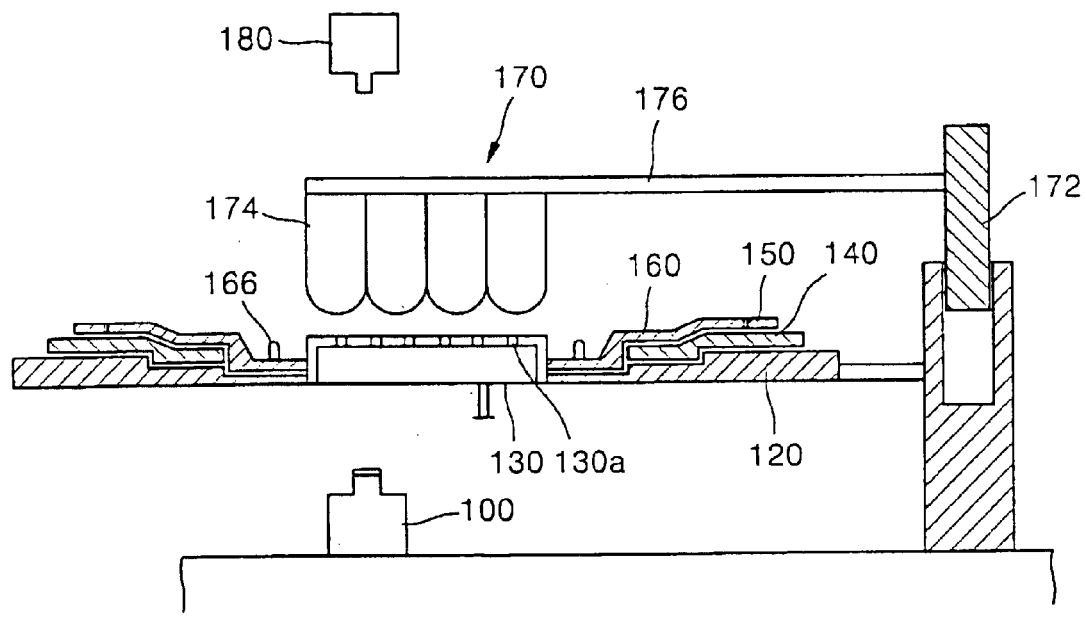
FIG. 4 is a sectional view illustrating a constitution of a chip scale marker according to a first preferred embodiment of the present invention.
Figure 5:
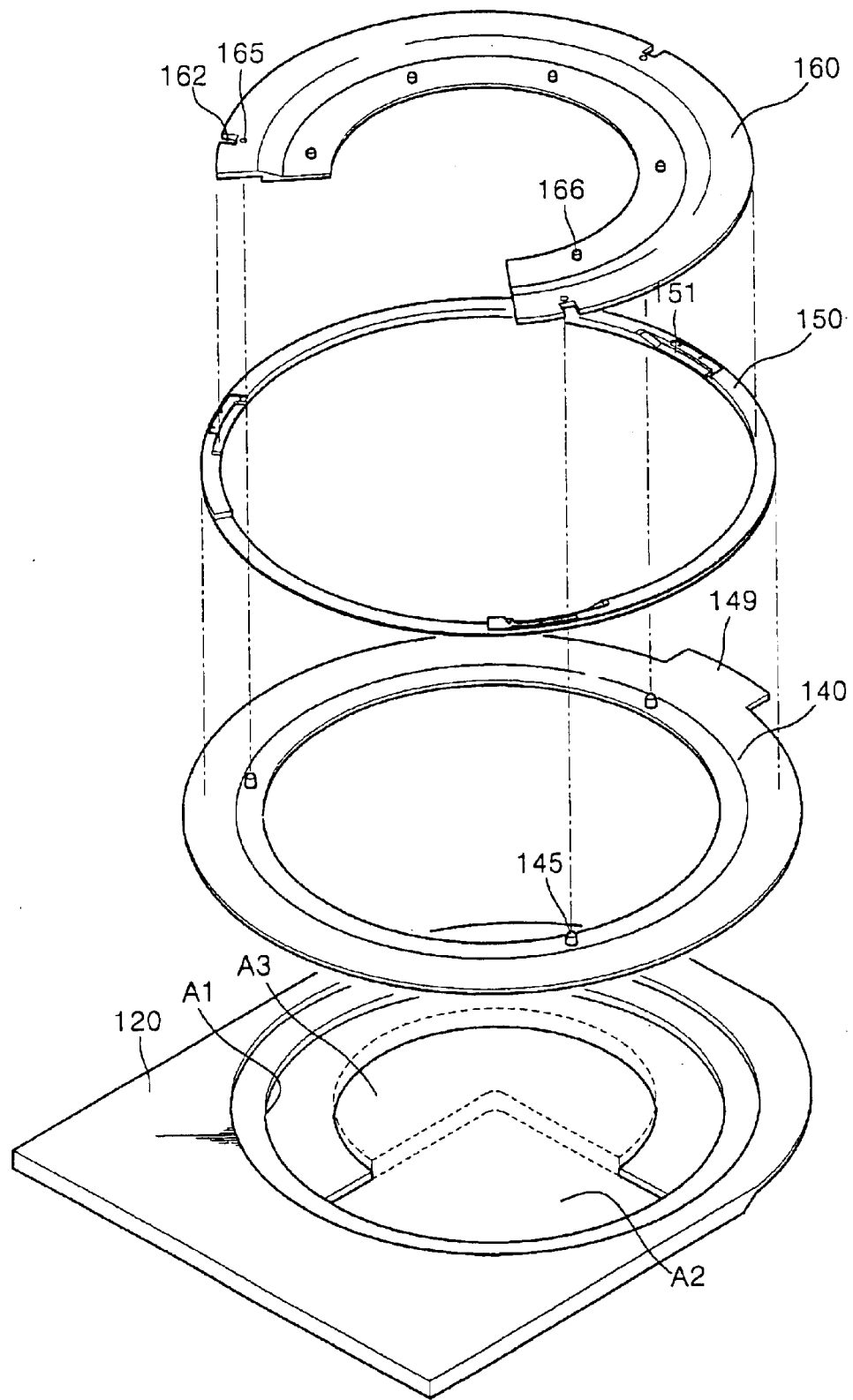
FIG. 5 is an exploded perspective view illustrating the wafer holder having a wafer rotating unit shown in FIG. 4.
Figure 6:
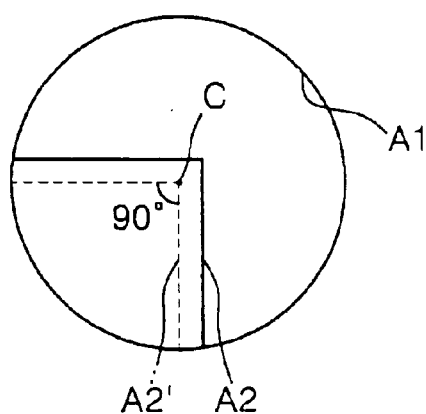
FIG. 6 is a view illustrating an open area of the wafer holder.
Figure 7:
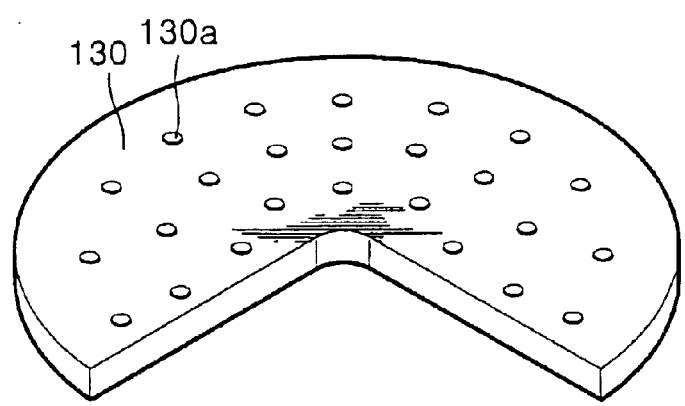
FIG. 7 is a perspective view illustrating a vacuum plate shown in FIG. 4.

Referring to FIGS. 4 through 6, one side of a wafer holder 120 is fixedly supported. An area A1 of the wafer holder 120 where a wafer is loaded includes first and second open areas A2 and A3. A laser beam is irradiated by a laser system 100 disposed under the wafer holder 120 onto a rear surface of the wafer through the first open area A2. The first open area A2 is preferably larger than an area A2' subject to laser marking which is divided by a predetermined angle with respect to a center point C of the area A1 of FIG. 6 when the wafer is placed to fit to the center of the wafer area A1. For example, when the wafer is rotated by an interval of 90° for marking, as shown in FIG. 6, the first open area A2 including the center point C which is larger than the laser marking area A2' is open. A vacuum plate 130 having a hollow structure as shown in FIG. 7 is fixed at the second open area A3. The vacuum plate 130 has an open area corresponding to the first open area A2 so that marking can be performed to a wafer disposed thereon.

The vacuum plate 130 is provided at the second open area A3 of the wafer holder 120 and has a predetermined diameter, for example, a diameter about 1 or 2 inches less than that of the wafer. The vacuum plate 130 includes a plurality of holes 130a as shown in FIG. 7. The lower portion of the vacuum plate 130 is connected to a vacuum pump (not shown). Preferably, an antistatic mat (not shown), for example, carbon rubber, is attached on a surface of the vacuum plate 130 contacting the wafer to avoid influence on circuits of the chips on the wafer. Also, the carbon rubber prevents the wafer from being broken by an impact caused during steps of removing warpage of the wafer and releasing the wafer from the vacuum plate 130, which are described later.

Figure 8:
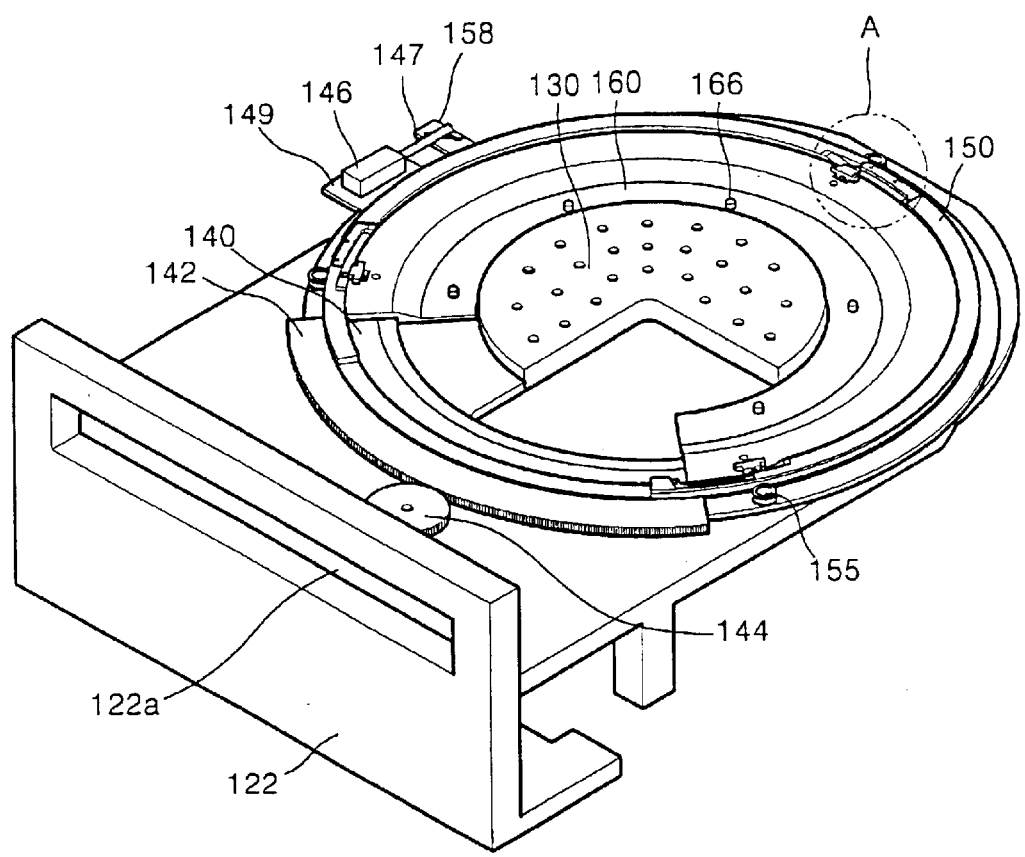
FIG. 8 is a perspective view illustrating the wafer holder having the wafer rotating unit.
Figure 9:
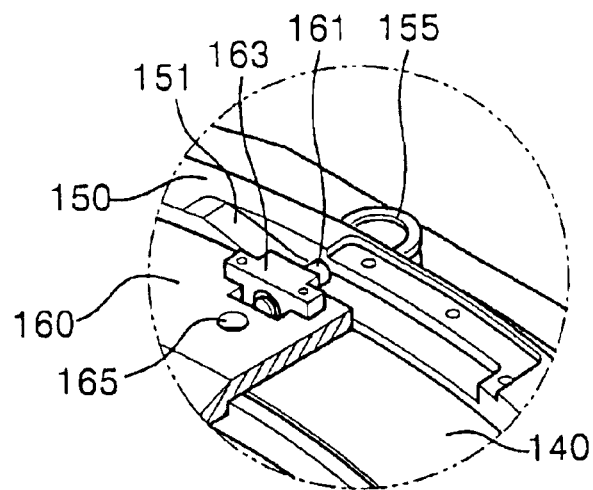
FIG. 9 is a magnified view of a portion A of FIG. 8.

FIG. 8 is a perspective view illustrating the wafer holder having the wafer rotating unit. FIG. 9 is a magnified view of a portion A of FIG. 8.

Referring to FIGS. 4, 8, and 9, reference numerals 140, 150, and 160 denote first through third plates which are annular and constitute a wafer rotating unit provided on the wafer holder 120, respectively. The first plate 140 is arranged on the wafer holder 120 to be isolated a predetermined distance from an outer circumference of the vacuum plate 130. The second plate 150 is arranged on the first plate 140. The third plate 160 is arranged between the second plate 150 and the vacuum plate 130 on the first plate 140.

One side of the third plate 160 is open to correspond to the first open area A2.

Referring back to FIG. 4, a pressing unit 170 is provided at an area corresponding to the vacuum plate 130 above the wafer holder 120. The positions of the chips on the wafer is measured by a CCD camera 180 disposed above the pressing unit 170 and the measured data is transferred to a controller (not shown). One side of the pressing unit 170 is connected to a vertical transfer shaft 172 to be moved up and down.

Figure 10:
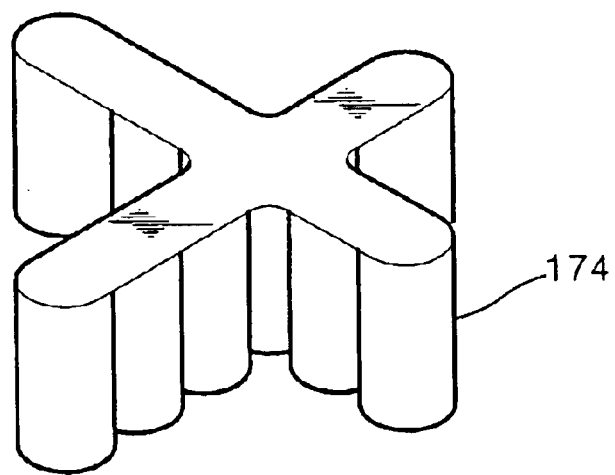
FIG. 10 is a perspective view illustrating an example of a pressing unit.

The pressing unit 170 presses the wafer on the vacuum plate 130 to flatten the wafer. For this purpose, the pressing unit 170 includes a pressing unit 174 having a shape covering the upper surface of the vacuum plate 130. FIG. 10 shows an example of the pressing unit 174. The upper portion of the pressing unit 174 is connected to the vertical transfer shaft 172 by a connection portion 176 so as to be moved vertically to press or release the wafer. The pressing unit 174 contacting the wafer preferably uses an antistatic material such as a conductive textile material formed by adding Cu and Ni metal to polyester (PET).

The inside of the pressing unit 174 is preferably filled with compressed air or sponge. When the pressing unit 174 is used by filling the inside thereof with the compressed air, the inside of the conductive textile material is preferably vinyl coated and connected to an external compressed air source to inject or exhaust the compressed air.

In the meantime, in FIG. 8, reference numeral 122 is a plate where a slit 122a is formed as an entrance through which a robot arm (not shown) transferring the wafer passes.

The first through third plates 140, 150, and 160 are described in detail below. Referring to FIG. 8, a gear plate 142 having a predetermined circumferential length is fixedly installed along the circumference of the first plate 140. The outer circumference of the gear plate 142 has a teethed portion. The gear plate 142 is driven by a pinion gear 144 provided on the wafer holder 120. When the pinion gear 144 is rotated, the first to third plates 140, 150, and 160 are rotated together. The gear plate 142 may be fabricated integrally with the first plate 140.

Figure 11:
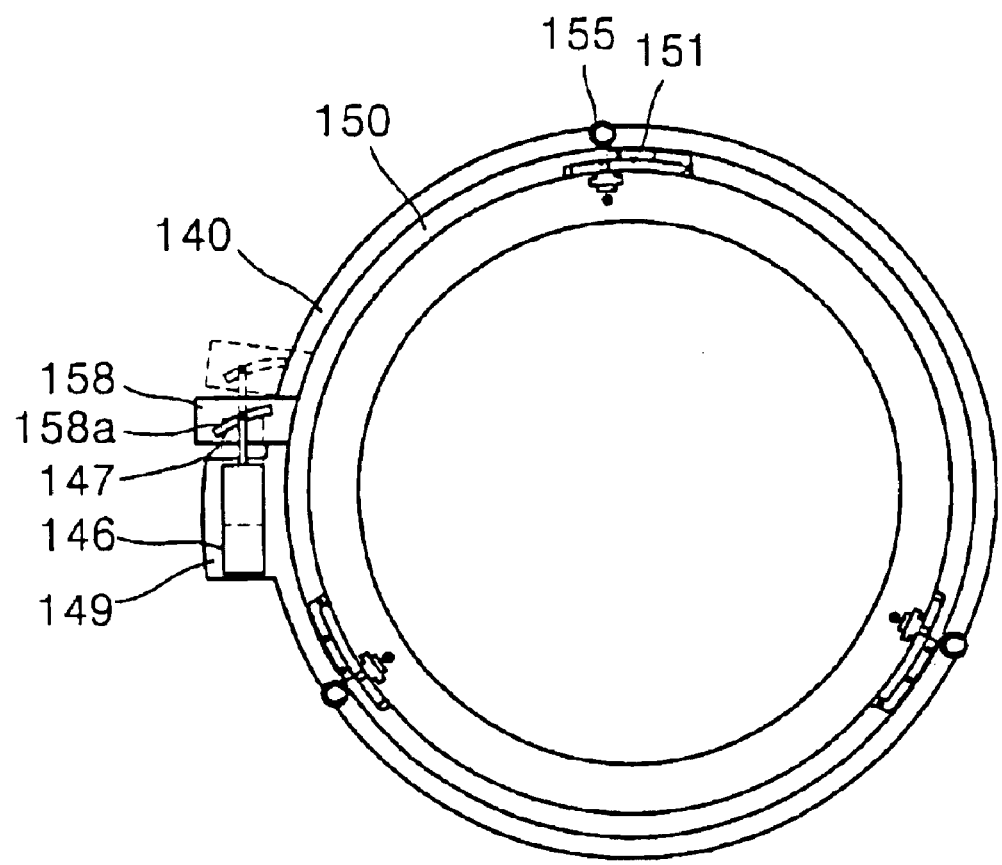
FIG. 11 is a plan view illustrating the operation of a pneumatic cylinder of FIG. 8.

A protruding portion 149 extending outwardly from one side of the circumference of the first plate 140 and supporting a pneumatic or electric cylinder (hereinafter, it is referred to as "the supporter") is formed. A pneumatic cylinder 146 is arranged on the supporter 149. A cylinder rod 147 of the pneumatic cylinder 146 is connected to a fixing member 158 fixed at the second plate 150. A curved slot 158a of FIG. 11 is formed in the fixing member 158. Thus, as shown in FIG. 11, when the cylinder rod 147 is moved linearly, one end of the cylinder rod 147 is moved along the curved slot 158a. As a result, the second plate 150 is rotated. Alternatively, instead of the curved slot 158a, a spring (not shown) having a predetermined strength can be connected the cylinder rod 147 and the fixing member 158. Thus, when the pneumatic cylinder 146 is operated to advance the cylinder rod 147, the second plate 150 is rotated with respect to the first plate 140 (please refer to an imagery line of FIG. 11).

Referring to FIG. 9, the inclined grooves 151 are formed at an inner circumferential surface of the second plate 150. Three grooves 162 are formed at the outer circumferential surface of the third plate 160 at an identical interval as shown in FIG. 5. A bushing 163 is fixedly installed at each of the grooves 162. A support pin 161 is rotatably installed in the bushing 163. Thus, the third plate 160 is supported by the second plate 150 by means of three support pins 161 which are arranged at three positions corresponding to the three inclined grooves 151. As the support pin 161 is moved along the inclined groove 151 by the operation of the pneumatic cylinder 146, the third plate 160 is moved up and down with respect to the first plate. Reference numeral 155 denotes a guide roller provided on the first plate 140 to guide the second plate 150 not to escape from a rotation path when the second plate 150 is rotated by the operation of the pneumatic cylinder 146. Preferably, the guide roller 155 is installed in contact with the circumference of the second plate 150 so as to be rotated by the rotation of the second plate 150.

The three plates 140, 150, and 160 are rotated together with the rotation of the pinion gear 144 and the third plate 160 is moved up and down with respect to the first plate 140 by the operation of the pneumatic cylinder 146. A plurality of protruding pins 145 of FIG. 5 are formed on the upper surface of the first plate 140. The same number of receiving holes 165 are formed in the third plates 160 at positions corresponding to the positions of the protruding pins 145. When the second plate 150 is rotated, the third plate 160 is moved vertically with respect to the first plate 140 by means of the protruding pins 145. Alternatively, the protruding pins 145 and the receiving holes 165 can be formed at the third plate 160 and the first plate 140, respectively.

A plurality of protruding portions 166 to facilitate accommodation of the wafer are formed in an area of the third plate 160 where the wafer is placed. The heights of the protruding portions 166 are preferably lower than the vacuum plate 130 in a state in which the third plate 160 is lowered.

The operation of the wafer holder 120 and the first through third plates 140, 150, and 160, will now be described with reference to the drawings. First, a process that the wafer is placed on the wafer holder 120 by the robot arm (not shown) is described. An open portion of the third plate 160 is disposed in a proceeding direction of the robot arm. For this purpose, the pinion gear 144 rotates the first plate 140 clockwise by about 45°, as shown in FIG. 8,. The robot arm holding the wafer enters over the open area of the third plate 160 through the slot 122a and is aligned on the vacuum plate 130.

The pneumatic cylinder 146 is operated to advance the cylinder rod 147 so that the second plate 150 is rotated and the third plate 160 is raised vertically from the first plate 140. When the third plate 160 ascends and the protruding portions 166 contact and support the wafer aligned on the vacuum plate 130, the robot arm is drawn out from the wafer holder 120 while the wafer is left on the third plate 160.

The pinion gear 144 is rotated the first plate 140 counterclockwise to return the third plate 160 to its original position, the open area of the third plate 160 overlaps the open area of the vacuum plate 130 and the wafer holder 120. The wafer is rotated while being placed on the protruding portions 166.

When the cylinder rod 147 of the pneumatic cylinder 146 is returned to the original position, the support pin 161 of the third plate 160 is lowered along the inclined groove 151 to its original position. As a result, the wafer is placed on the vacuum plate 130.

As the vertical transfer shaft 172 is moved a predetermined distance downward, the wafer is pressed by the pressing unit 174. In this state, air is removed from the inside of the vacuum plate 130 so that the wafer adheres to the vacuum plate 130. Accordingly, warpage is removed from the wafer.

The vertical transfer shaft 172 connected to the pressing unit 174 is moved upward. The CCD camera 180 photographs the wafer thereunder and transmits positional information of the chips to the controller (not shown). The controller recognizes the positions of the chips from the input positional information of the chips and controls the laser system 100 to perform marking.

When the chip marking in the open area is completed, the vacuum pump (not shown) connected to the vacuum plate 130 is turned off and the cylinder rod 147 of the pneumatic cylinder 146 is advanced. The third plate 160 is raised so that the wafer is raised by the third plate. That is, the wafer is separated a predetermined distance upward from the vacuum plate 160. Then, when the pinion gear 144 rotates the first plate 140 by about 90° clockwise, the second and third plates 150 and 160 and the wafer are rotated together by 90° clockwise.

A process of returning the first through third plates 140, 150, and 160 except for the wafer to the original positions is described below. First, the pneumatic cylinder 146 is operated to return the cylinder rod 147 to its original position so that the wafer is placed on the vacuum plate 130. The pressing unit 174 is moved downward by using the vertical transfer shaft 172 to flatten the wafer. The inside of the vacuum plate 130 is made vacuous so that the wafer is fixed to the vacuum plate 130. Next, the pinion gear 144 is rotated by 90° counterclockwise. At this time, the second and third plates 150 and 160 return to their original states on the first plate 140 while the wafer fixed on the vacuum plate 130 remains as being rotated by 90° clockwise. Then, the CCD camera 180 photographs the positions of the chips and marking is performed.

Then, a marking work with respect to the chips formed on the remaining area of the wafer is performed by repeating the above method.

Figure 12:
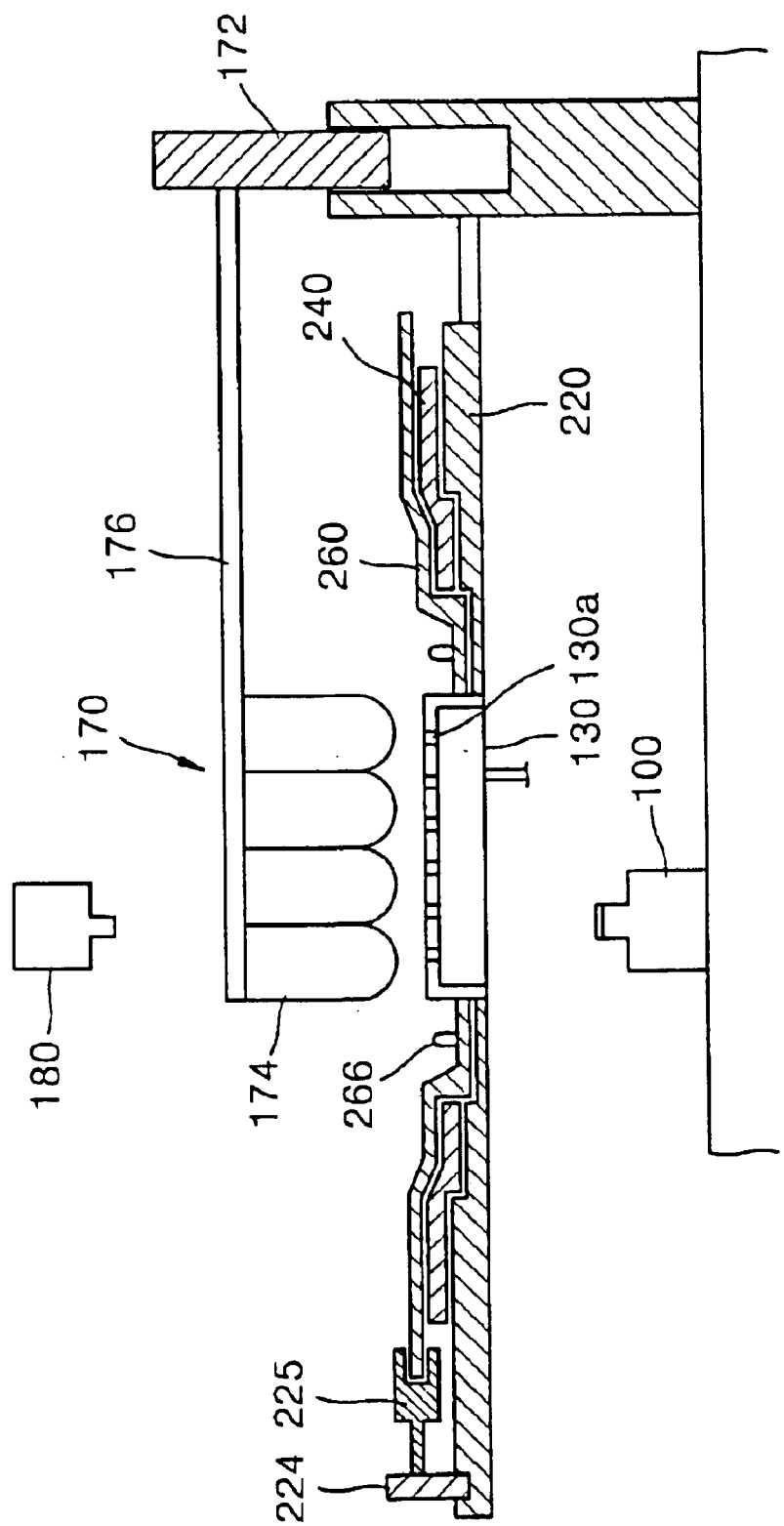
FIG. 12 is a sectional view illustrating a constitution of a chip scale marker according to a second preferred embodiment of the present invention.
Figure 13:
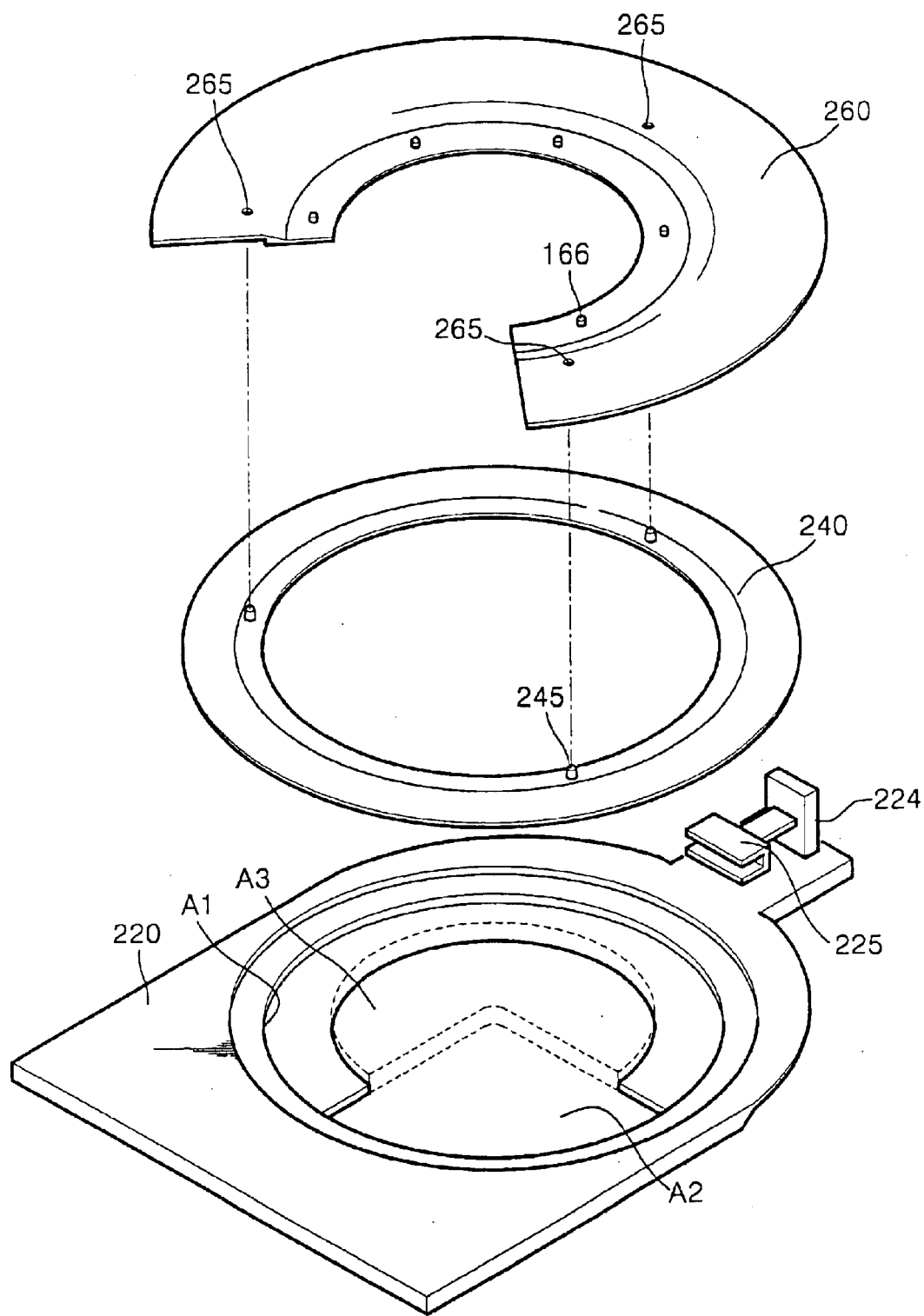
FIG. 13 is an exploded perspective view illustrating the wafer holder having a wafer rotating unit shown in FIG. 12.

FIG. 12 is a sectional view illustrating a constitution of a chip scale marker according to a second preferred embodiment of the present invention. FIG. 13 is an exploded perspective view illustrating the wafer holder having a wafer rotating unit shown in FIG. 12. The same elements as those of the first preferred embodiment use the same reference numerals and detailed descriptions thereof will be omitted.

Referring to FIGS. 12 and 13, one side of a wafer holder 220 is fixedly supported. The area A1 of the wafer holder 220 where a wafer is loaded includes first and second open areas A2 and A3. A laser beam is irradiated by the laser system 100 disposed under the wafer holder 120 onto a rear surface of the wafer through the first open area A2. When the wafer is disposed at the center of the wafer area A1, the first open area A2 is preferably larger than the area A2' subject to laser marking which is divided by a predetermined angle with respect to a center point C of the area A1. The vacuum plate 130 having a plurality of holes as shown in FIG. 7 is fixed at the second open area A3. An area of the vacuum plate 130 corresponding to the first open area A2 is open so that marking is performed to the wafer disposed above the open area.

The vacuum plate 130 includes a plurality of the holes 130a as shown in FIG. 7. A lower portion of the vacuum plate 130 is connected to a vacuum pump (not shown). An antistatic mat (not shown), for example, carbon rubber, is preferably attached to a surface of the vacuum plate 130 contacting the wafer to prevent the circuits of the chips of the wafer from being affected. Also, the carbon rubber prevents the wafer from being broken due to an impact caused during the steps of removing warpage of the wafer and releasing the wafer from the vacuum plate 130 which will be described later.

Figure 14:
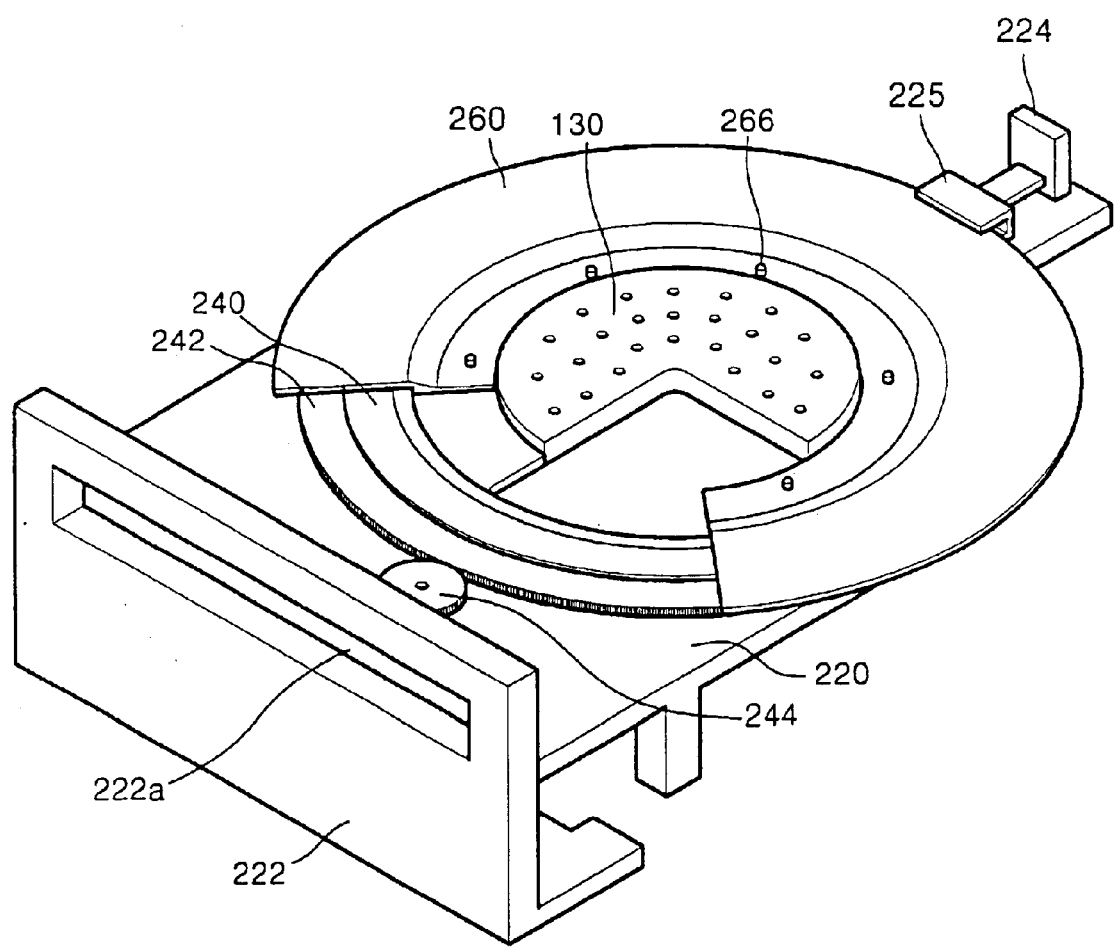
FIG. 14 is a perspective view illustrating the wafer holder having the wafer rotating unit.

FIG. 14 is a perspective view illustrating the wafer holder having the wafer rotating unit.

Referring to FIGS. 12 and 14, reference numerals 240 and 260 denote fourth and fifth annular plates constituting a wafer rotating unit provided on the wafer holder 220, respectively. The fourth plate 240 is arranged on the wafer holder 220 to be a predetermined distance from the outer circumference of the vacuum plate 130. The fifth plate 260 is arranged such that the inner circumference of the fifth plate 260 contacts the vacuum plate 130 and one side thereof is open to correspond to the first open area A2. The outer circumference of the fifth plate 260 is supported to be held by a holder 225 of a vertical transfer shaft 224 provided on the wafer holder 220 and vertically moved on the wafer holder 220 with the vertical movement of the vertical transfer shaft 224.

Referring back to FIG. 12, the pressing unit 170 is provided at the area corresponding to the vacuum plate 130 above the wafer holder 220. The positions of the chips on the wafer are measured by the CCD camera 180 arranged above the pressing unit 170 and the measured data is transferred to the controller (not shown). One side of the pressing unit 170 is connected to the vertical transfer shaft 172 to be moved up and down.

In FIG. 14, reference numeral 222 denotes a plate where a slit 222a is formed as an entrance for a robot arm (not shown) transferring the wafer.

The fourth and fifth plates 240 and 260 will now be described in detail.

Referring to FIG. 14, a gear plate 242 having a predetermined circumferential length is fixedly installed along the circumference of the fourth plate 240. The outer circumference of the gear plate 242 has a teethed portion. The gear plate 242 is driven by a pinion gear 244 provided at the wafer holder 220. When the pinion gear 244 is rotated, the fourth and fifth plates 240 and 260 are rotated together. The gear plate 242 may be fabricated integrally with the first plate 240.

A plurality of pins 245 of FIG. 13 are formed on an upper surface of the fourth plate 240. The same number of holes 265 as that of the pins 245 are formed of the fifth plate 260. The pins 245 are formed at positions corresponding to the holes 265. When the fifth plate 260 is moved vertically from the fourth plate 240 by the vertical transfer shaft 224, the fifth plate 260 can vertically move from the fourth plate 240 without a lateral deviation due to the pins 245 and the holes 265. The pins 245 and the holes 265 can be formed on the fifth plate 260 and the fourth plate 240, respectively.

A plurality of protruding portions 266 to facilitate accommodation of the wafer are formed in an area of the fifth plate 260 where the wafer is accommodated. The height of the protruding portions 266 is preferably lower than that of the vacuum plate 130 in a state in which the fifth plate 260 is lowered.

The operations of the wafer holder 220 and the fourth and fifth plates 240 and 260 will now be described with reference to the drawings.

First, the step of placing the wafer on the wafer holder 220 by the robot (not shown) is described. When the open portion of the fifth plate 260 is aligned in the open area A2 of the wafer holder 220, the robot arm holding the wafer enters through the slot 222a to be aligned above the vacuum plate 230. The vertical transfer shaft 224 supporting the holder 225 holding the outer circumference of the fifth plate 260 is raised so that the protruding portions 266 contact the wafer aligned above the vacuum plate 130. Then, the robot arm is drawn out from the wafer holder 220 while the wafer is left on the fifth plate 260.

Next, when the vertical transfer shaft 224 is lowered, the fifth plate 260 returns to its original position and as a result, the wafer is placed on the vacuum plate 130. The vertical transfer shaft 172 is moved a predetermined distance downward so that the wafer is pressed by the pressing unit 174. In this state, air is removed from the inside of the vacuum plate 130 so that the wafer adheres to the vacuum plate 130. Accordingly, warpage of the wafer is removed.

Next, when the vertical transfer shaft 172 connected to the pressing unit 174 is moved upward, the CCD camera 180 photographs the wafer and transmits positional information of the chips to the controller. The controller recognizes the positions of the chips from the input positional information of the chips so that the marking work of the laser system 100 is performed.

When the chip marking in the open area is completed, the vacuum pump connected to the vacuum plate 130 is turned off. The vertical transfer shaft 224 is raised to move the fifth plate 260 supported by the holder 225 upward so that the wafer on the fifth plate 260 is separated from the vacuum plate 130. That is, the wafer is separated a predetermined distance upward from the vacuum plate 130. Then, when the pinion gear 244 rotates the fourth plate 240 by about 90° clockwise, since the pins 245 of the fourth plate 240 are engaged with the holes 265, the fifth plate 260 is rotated by 90° clockwise together with the wafer. The holder 225 of the vertical transfer shaft 224 supports the fifth plate 260 to be capable of sliding.

The step of returning the fourth and fifth plates 240 and 260 to their original positions without moving the wafer is described. First, the wafer is placed on the vacuum plate 130 by moving the vertical transfer shaft 224 downward. The pressing unit 174 is moved downward using the vertical transfer shaft 224 to flatten the wafer. The inside of the vacuum plate 130 is made vacuous to fix the wafer to the vacuum plate 130. Then, the vertical transfer shaft 172 is moved upward to remove the pressing unit 174 from the wafer. The pinion gear 144 is rotated by 90° counterclockwise. The fifth plate 260 returns to the original position on the fourth plate 240 while the wafer fixed on the vacuum plate 130 remains the position in the state of being rotated by 90° clockwise. The CCD camera 180 photographs the positions of the chips and marking is performed. Then, the above method is repeated so that the marking work is performed with respect to the chips formed in the remaining area of the wafer.

As described above, according to the chip scale marker and the marking method according to the present invention, since marking is performed by flattening the wafer having warpage before wafer marking so that the chips of the wafer are all disposed at a predetermined marking distance from the laser system, marking quality is improved.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A chip scale marker comprising:
   a laser system performing laser marking;
   a wafer holder on which a wafer subject to the laser marking is mounted, the wafer holder comprising a vacuum plate disposed at a center of the wafer holder for sucking the wafer and a wafer rotating unit provided at a circumference of the vacuum plate and having an open area facing the laser system;
   a camera disposed above the wafer holder to photograph the wafer; and
   a warpage removing unit provided above the wafer holder for removing warpage from the wafer.

2. The chip scale marker as claimed in claim 1, wherein the open portion of the wafer holder is at least ¼ of the wafer mounted thereon.

3. The chip scale marker as claimed in claim 1, wherein the wafer rotating unit comprises:
   a first plate which is annular and rotates on the wafer holder;
   a second plate which is annular and rotates on the first plate; and
   a third plate which is annular and disposed between the vacuum plate and the second plate,
   wherein the second plate is rotated by a driving unit provided on the first plate, and the third plate is in contact with the second plate so as to be moved up and down by rotation of the second plate and has an open area corresponding to the open area of the wafer holder.

4. The chip scale marker as claimed in claim 3, wherein an outer circumference of the first plate has a teethed portion and a pinion gear rotating the teethed portion of the first plate is provided around the first plate.

5. The chip scale marker as claimed in claim 3, wherein the driving unit is a pneumatic cylinder or an electric cylinder having a body fixed at an outer circumference of the first plate and an end of a cylinder rod protruding from the body connected to the second plate.

6. The chip scale marker as claimed in claim 3, wherein a plurality of inclined grooves contacting a member protruding from the third plate are formed on an inner circumferential surface of the second plate.

7. The chip scale marker as claimed in claim 6, wherein the protruding member are a plurality of support pins formed at an outer circumference of the third plate, placed on the inclined grooves, making the third plate supported by the second plate, and moving the third plate up and down with respect to the first plate while moving along the inclined grooves according to rotation of the second plate.

8. The chip scale marker as claimed in claim 3, wherein a guide unit guiding rotation of the second plate is provided on the first plate.

9. The chip scale marker as claimed in claim 3, wherein, to enable vertical lift of the third plate when the second plate rotates, a plurality of pins are form on the first plate and a plurality of holes corresponding to the pins are formed in the third plate.

10. The chip scale marker as claimed in claim 3, wherein, to enable vertical lift of the third plate when the second plate rotates, a plurality of holes are formed in the first plate and a plurality of pins corresponding to the holes are formed on the third plate.

11. The chip scale marker as claimed in claim 1, wherein the wafer rotating unit comprises:
   a fourth plate which is annular and rotates on the wafer holder;
   a fifth plate which is rotated by the fourth plate on the fourth plate; and
   a vertical transfer shaft provided on the wafer holder and vertically moving the fifth plate by holding one side of the fifth plate,
   wherein the fifth plate has an open area corresponding to the open area of the wafer holder.

12. The chip scale marker as claimed in claim 11, wherein an outer circumference of the fourth plate has a teethed portion and a pinion gear rotating the teethed portion of the fourth plate is provided around the fourth plate.

13. The chip scale marker as claimed in claim 11, wherein, to enable vertical lift of the fifth plate when the fourth plate rotates, a plurality of pins are form on the fourth plate and a plurality of holes corresponding to the pins are formed in the fifth plate.

14. The chip scale marker as claimed in claim 3, wherein, to enable vertical lift of the fifth plate when the fourth plate rotates, a plurality of holes are formed in the fourth plate and a plurality of pins corresponding to the holes are formed on the fifth plate.

15. The chip scale marker as claimed in claim 1, wherein the vacuum plate has a plurality of holes on a surface of the vacuum plate, the inside of the vacuum plate has a hollow structure, and a vacuum pump is connected to a lower portion of the vacuum plate.

16. The chip scale marker as claimed in claim 15, wherein an antistatic mat is formed on a surface of the vacuum plate.

17. The chip scale marker as claimed in claim 16, wherein the antistatic mat is formed of carbon rubber.

18. The chip scale marker as claimed in claim 1, wherein the warpage removing unit moves vertically above the wafer and is a bag filled with a predetermined filler to apply a force downward on the wafer.

19. The chip scale marker as claimed in claim 18, wherein an outer portion of the bag is a conductive textile material which is made of polyester (PET) by adding Cu or Ni metal.

20. The chip scale marker as claimed in claim 19, wherein the filler is a sponge.

21. The chip scale marker as claimed in claim 18, wherein an inner portion of the bag is vinyl coated and the outer portion of the bag is a conductive textile material which is made of polyester (PET) by adding Cu or Ni metal.

22. The chip scale marker as claimed in claim 21, wherein the filler is compressed air.

23. A method for performing marking using a chip scale marker including a laser system performing laser marking, a wafer holder on which a wafer subject to the laser marking is mounted, the wafer holder comprising a vacuum plate disposed at a center of the wafer holder for sucking the wafer and a wafer rotating unit provided at a circumference of the vacuum plate and having an open area facing the laser system, a camera disposed above the wafer holder to photograph the wafer, and a warpage removing unit provided above the wafer holder for removing warpage from the wafer, the method comprising the steps of:

(a) mounting the wafer on the wafer holder;

(b) removing warpage by pressing the wafer using the warpage removing unit;

(c) measuring positions of chips by photographing the wafer to recognize the positions of chips;

(d) marking the chips through the open portion of the wafer holder using the laser system according to the information on the positions of the chips;

(e) releasing the warpage removing unit from the wafer; and (f) repeating steps (b) through (e) by rotating the wafer by a predetermined angle using the wafer rotating unit.

24. The method as claimed in claim 23, wherein step (b) further comprises a step of fixing the wafer on the vacuum plate by sucking the wafer.

25. The method as claimed in claim 23, wherein the warpage removing unit moves vertically above the wafer and is a bag filled with a predetermined filler to apply a force downward to the wafer.

26. The method as claimed in claim 23, wherein the wafer rotating unit comprises:

a first plate which is annular and rotates on the wafer holder;

a second plate which is annular and rotates on the first plate; and a third plate which is annular and provided between the vacuum plate and the second plate, wherein the second plate is rotated by a driving unit provided on the first plate, and the third plate is in contact with the second plate so as to be moved up and down by rotation of the second plate and has an open area corresponding to the open area of the wafer holder.

27. The method as claimed in claim 23, wherein the wafer rotating unit comprises:

a fourth plate which is annular and rotates on the wafer holder;

a fifth plate which is rotated by the fourth plate on the fourth plate; and a vertical transfer shaft provided on the wafer holder and vertically moving the fifth plate by holding one side of the fifth plate, wherein the fifth plate has an open area corresponding to the open area of the wafer holder.

* * * * *